(12) United States Patent
Nishi

(10) Patent No.: US 9,281,370 B2
(45) Date of Patent: Mar. 8, 2016

(54) SEMICONDUCTOR DEVICE AND METHOD OF MANUFACTURING SEMICONDUCTOR DEVICE

(71) Applicant: Sumitomo Electric Device Innovations, Inc., Yokohama (JP)

(72) Inventor: Masahiro Nishi, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/318,064

(22) Filed: Jun. 27, 2014

(65) Prior Publication Data

US 2015/0001721 A1 Jan. 1, 2015

(30) Foreign Application Priority Data

Jun. 28, 2013 (JP) ................. 2013-137116

(51) Int. Cl.
| | |
|---|---|
| H01L 21/338 | (2006.01) |
| H01L 29/45 | (2006.01) |
| H01L 21/285 | (2006.01) |
| H01L 29/417 | (2006.01) |
| H01L 29/423 | (2006.01) |
| H01L 29/66 | (2006.01) |
| H01L 29/20 | (2006.01) |

(52) U.S. Cl.
CPC ........ H01L 29/452 (2013.01); H01L 21/28575 (2013.01); H01L 21/28587 (2013.01); H01L 29/41733 (2013.01); H01L 29/42312 (2013.01); H01L 29/66462 (2013.01); H01L 29/2003 (2013.01)

(58) Field of Classification Search
USPC ............ 257/194, 192, E29.249, E29.089, 27; 438/172, 197, 301, 570, 574, 706, 745, 438/791, 167, 207, 261, 286, 306, 309, 319, 438/381, 400, 411, 479, 50, 571, 572, 576, 438/579, 718, 720, 724, 758, 909
See application file for complete search history.

(56) References Cited

U.S. PATENT DOCUMENTS

| | | | | |
|---|---|---|---|---|
| 7,442,999 | B2* | 10/2008 | Kurachi et al. | 257/406 |
| 8,766,302 | B2* | 7/2014 | Choi et al. | 257/98 |
| 2006/0220192 | A1* | 10/2006 | Kurachi et al. | 257/669 |
| 2007/0228415 | A1* | 10/2007 | Kanamura et al. | 257/192 |
| 2013/0119420 | A1* | 5/2013 | Choi et al. | 257/98 |
| 2014/0264421 | A1* | 9/2014 | Choi et al. | 257/98 |
| 2015/0069405 | A1* | 3/2015 | Yoshioka et al. | 257/76 |

FOREIGN PATENT DOCUMENTS

JP 2008-278812 10/2006

* cited by examiner

*Primary Examiner* — Telly Green
(74) *Attorney, Agent, or Firm* — Venable LLP; Michael A. Sartori; Laura G. Remus

(57) ABSTRACT

A manufacturing method according to an embodiment of this invention is a method of manufacturing a semiconductor device, which has: a first step of forming a first electrode 22 containing Ti or Ta on a top face of a nitride semiconductor layer 18; a second step of forming a second electrode 24 containing Al on a top face of the first electrode 22; a third step of forming a coating metal layer 26 covering at least one of an edge of a top face of the second electrode 24 and a side face of the second electrode 24, having a window 26*a* exposing the top face of the second electrode 24 in a region separated from the foregoing edge, and containing at least one of Ta, Mo, Pd, Ni, and Ti; and a step of performing a thermal treatment, after the third step.

7 Claims, 15 Drawing Sheets

(a)

(b)

(c)

(a)

(b)

(c)

(a)

(b)

(c)

(a)

(b)

(c)

(a)

(b)

(c)

(a)

(b)

(a)

(b)

(c)

(a)

(b)

(c)

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a method of manufacturing the semiconductor device.

2. Related Background Art

Field Effect Transistors (FET) such as High Electron Mobility Transistors (HEMT) using nitride semiconductors have attracted attention as amplifiers operating at high frequencies and high output powers, e.g., amplifiers for base stations of cell phones. In addition, there is a developed technology for suppressing the current collapse that takes place in high-voltage operation of HEMT using nitride semiconductors (e.g., cf. Patent Literature 1).

Patent Literature 1: Japanese Patent Application Laid-Open Publication No. 2006-278812

SUMMARY OF THE INVENTION

Aluminum (Al) is used for ohmic electrodes of semiconductor devices using nitride semiconductors. In this case, hillocks are generated on Al of the ohmic electrodes by a thermal treatment or the like. If the hillocks are located in proximity to or in contact with a gate electrode, the reliability will degrade. If a semiconductor device using nitride semiconductors is operated at high voltage, an electric field will be concentrated at the gate-electrode-side edge of the ohmic electrode to cause dielectric breakdown, resulting in degradation of reliability.

The present invention has been accomplished in view of the above problem and it is an object of the present invention to achieve improvement in reliability.

One aspect of the present invention is a method of manufacturing a semiconductor device, comprising: a first step of forming a first electrode containing Ti or Ta on a top face of a nitride semiconductor layer; a second step of forming a second electrode containing Al on a top face of the first electrode; a third step of forming a coating metal layer covering at least one of an edge of a top face of the second electrode and a side face of the second electrode, having a window exposing the top face of the second electrode in a region separated from the foregoing edge, and containing at least one of Ta, Mo, Pd, Ni, and a step of performing a thermal treatment, after the third step. According to the one aspect of the present invention, improvement in reliability is achieved.

In the foregoing configuration mentioned above, there may be a configuration wherein a structure having the first electrode, the second electrode, and the coating metal layer constitutes at least one of a source electrode and a drain electrode arranged next to a gate electrode and wherein the coating metal layer is arranged on at least one of the edge of the top face of the second electrode and the side face of the second electrode on the side closer to the gate electrode.

In the foregoing configuration mentioned above, there may be a configuration wherein the coating metal layer is provided on both of the edge of the top face of the second electrode and the side face of the second electrode.

In the foregoing configuration mentioned above, there may be a configuration wherein the coating metal layer covering the edge of the top face of the second electrode and the coating metal layer covering the side face of the second electrode are electrically connected.

In the foregoing configuration mentioned above, there may be a configuration wherein the coating metal layer covering the edge of the top face of the second electrode and the coating metal layer covering the side face of the second electrode are composed of an identical material.

In the foregoing configuration mentioned above, there may be a configuration wherein the nitride semiconductor layer is gallium nitride or aluminum gallium nitride and wherein the thermal treatment is carried out at a temperature of not less than 500° C. and not more than 800° C.

One aspect of the present invention is a semiconductor device comprising: a first electrode provided on a top face of a nitride semiconductor layer and containing Ti or Ta; a second electrode provided on a top face of the first electrode and containing Al; a coating metal layer covering at least one of an edge of a top face of the second electrode and a side face of the second electrode, having a window in a region separated from the foregoing edge, and containing at least one of Ta, Mo, Pd, Ni, and Ti; and a high-resistance region which exists corresponding to a region where the coating metal layer is provided and in which a contact resistance between the nitride semiconductor layer and the first electrode is higher than that in the region where the window is provided. According to the one aspect of the present invention, improvement in reliability is achieved.

One aspect of the present invention is a semiconductor device comprising: a first electrode provided on a top face of a nitride semiconductor layer and containing Ti or Ta; a second electrode provided on a top face of the first electrode and containing Al; a coating metal layer covering at least one of an edge of a top face of the second electrode and a side face of the second electrode, having a window in a region separated from the foregoing edge, and containing at least one of Ta, Mo, Pd, Ni, and Ti; and an insulating film provided on the coating metal layer. According to the one aspect of the present invention, improvement in reliability is achieved.

One aspect of the present invention leads to achieve, for example, improvement in reliability or the like.

DESCRIPTION OF THE PREFERRED EMBODIMENTS

Embodiments of the present invention will be described below.

Embodiment 1

Figure 1:
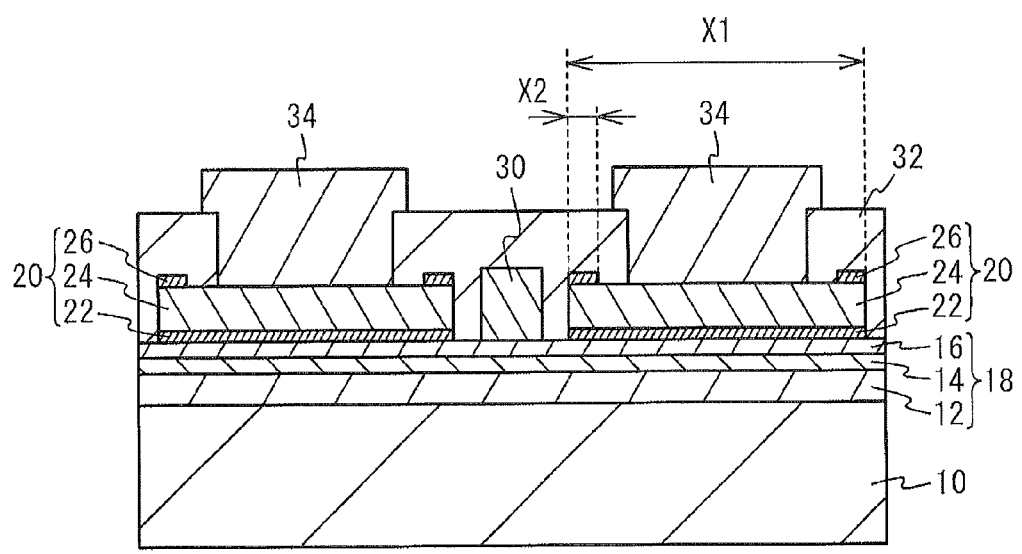
FIG. 1 is a cross-sectional view showing a semiconductor device according to Embodiment 1.

FIG. 1 is a cross-sectional view showing a semiconductor device according to Embodiment 1. Embodiment 1 will describe an example of a HEMT using nitride semiconductors. As shown in FIG. 1, a nitride semiconductor layer 18 is provided on a substrate 10. The substrate 10 is, for example, a silicon carbide (SiC) substrate, a silicon (Si) substrate, or a sapphire substrate. The nitride semiconductor layer 18 has an electron transit layer 12, an electron supply layer 14, and a cap layer 16 from the substrate 10 side. The electron transit layer 12 is, for example, an undoped gallium nitride (GaN) layer in the film thickness of 1.0 µm. The electron supply layer 14 is, for example, an aluminum gallium nitride (AlGaN) layer in the film thickness of 20 nm. The cap layer 16 is, for example, an n-type GaN layer in the film thickness of 5 nm. An aluminum nitride (AlN) layer may be provided as a buffer layer between the substrate 10 and the electron transit layer 12.

A gate electrode 30, and ohmic electrodes 20 as a source electrode and a drain electrode, are provided on the nitride semiconductor layer 18. The gate electrode 30 and the ohmic electrodes 20 are arranged next to each other in a line. In FIG. 1 the ohmic electrodes 20 are formed in contact with the cap layer 16, but they may be formed in contact with the electron supply layer 14 while the cap layer 16 is removed from the regions where the ohmic electrodes 20 are located. Namely, the ohmic electrodes 20 are in contact with gallium nitride (GaN) or aluminum gallium nitride (AlGaN). Each of the ohmic electrodes 20 has a first electrode 22, a second electrode 24, and a coating metal layer 26 from the nitride semiconductor layer 18 side. The first electrode 22 is, for example, a tantalum (Ta) layer in the film thickness of 10 nm and is provided on a top face of the nitride semiconductor layer 18. The second electrode 24 is, for example, an aluminum (Al) layer in the film thickness of 400 nm and is provided on a top face of the first electrode 22. The coating metal layer 26 is, for example, a Ta layer in the film thickness of 20 nm and is provided on a peripheral area of a top face of the second electrode 24. Embodiment 1 will describe an example where the coating metal layer 26 is provided over the entire peripheral area of the top face of the second electrode 24. As shown in FIG. 1, a preferred configuration is such that the side face of the second electrode 24 is flush with the side face of the coating metal layer 26, but they may be formed with a level difference between them. In the direction of the line of the ohmic electrodes 20 and the gate electrode 30, the width X1 of the second electrode 24 is, for example, 20 µm and the width X2 of the coating metal layer 26, for example, 1.0 µm. The width X1 may be appropriately selected, for example, in the range of 20 µm to 100 µm. The gate electrode 30 is, for example, a metal film in which nickel (Ni) and gold (Au) layers are stacked from the nitride semiconductor layer 18 side.

An interlayer dielectric film 32, e.g., of silicon nitride (SiN) is provided so as to cover the ohmic electrodes 20 and the gate electrode 30. Apertures are formed in the interlayer dielectric film 32 on the ohmic electrodes 20 and a wiring layer 34 is buried in each of the apertures. The wiring layer 34 is in contact with the top face of the second electrode 24 of the corresponding ohmic electrode 20. The interlayer dielectric film 32 is interposed between the wiring layer 34 and the coating metal layer 26. The wiring layer 34 is, for example, a metal film in which 5-nm titanium (Ti), 100-nm platinum (Pt), and 2-µm gold (Au) layers are stacked from the ohmic electrode 20 side.

Figure 2:
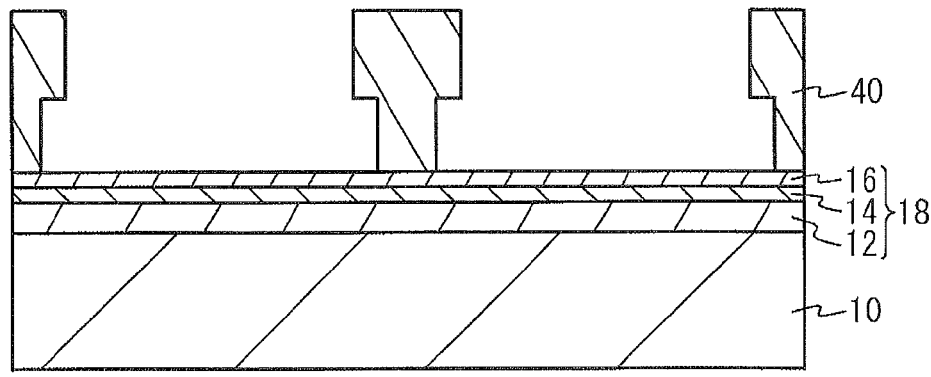
FIG. 2(a) to FIG. 2(c) are cross-sectional views (Part 1) showing a method of manufacturing the semiconductor device according to Embodiment 1.
Figure 2:
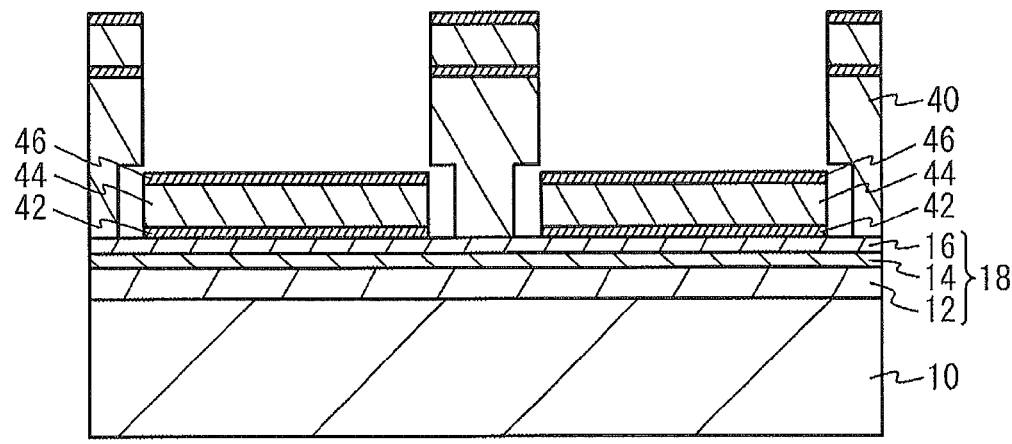
Figure 2:
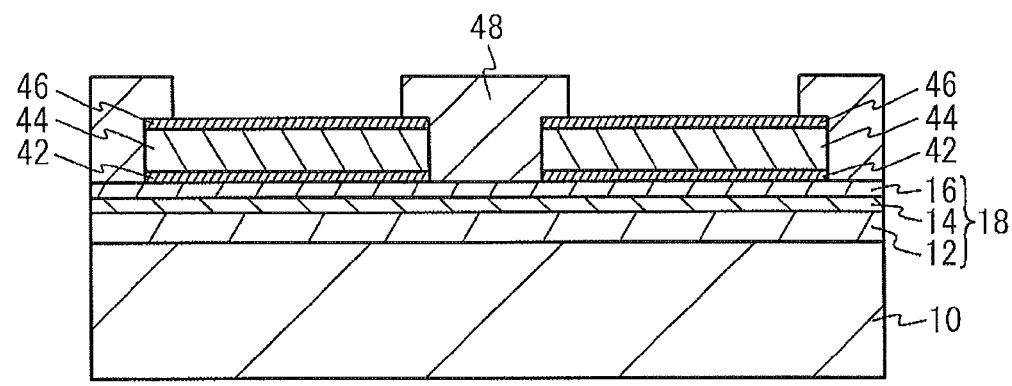
Figure 3:
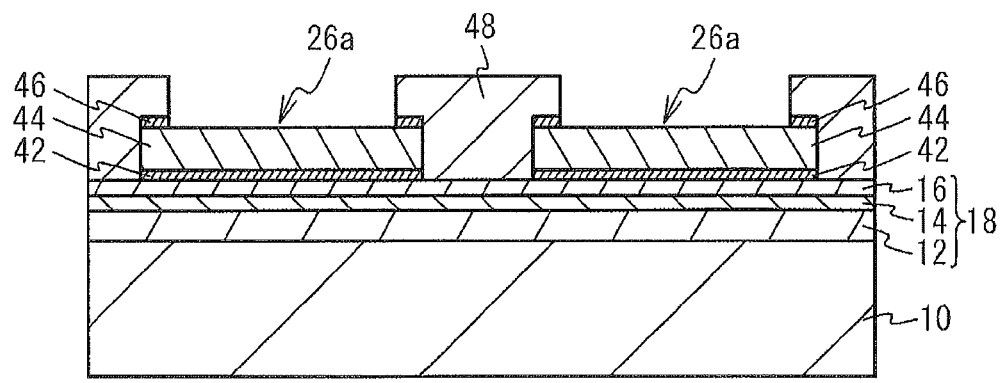
FIG. 3(a) to FIG. 3(c) are cross-sectional views (Part 2) showing the method of manufacturing the semiconductor device according to Embodiment 1.
Figure 3:
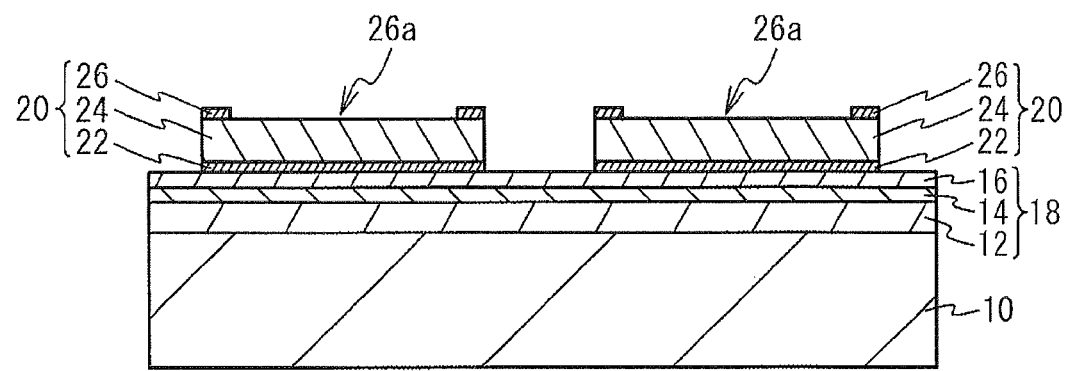
Figure 3:
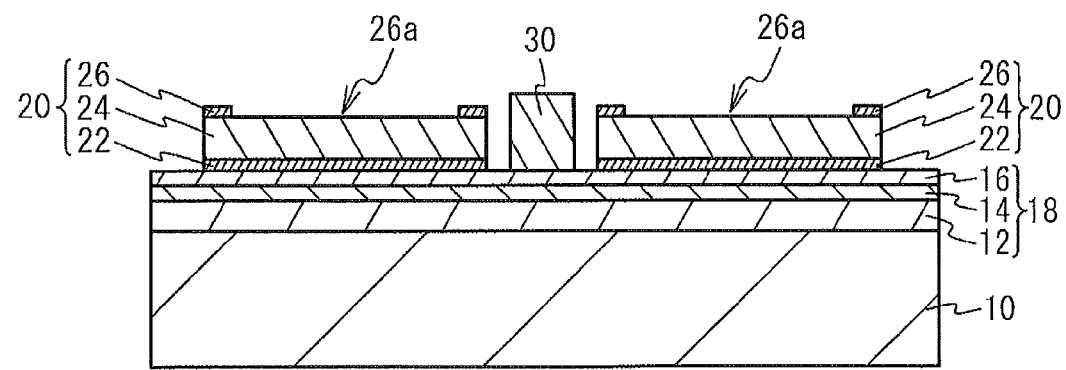
Figure 4:
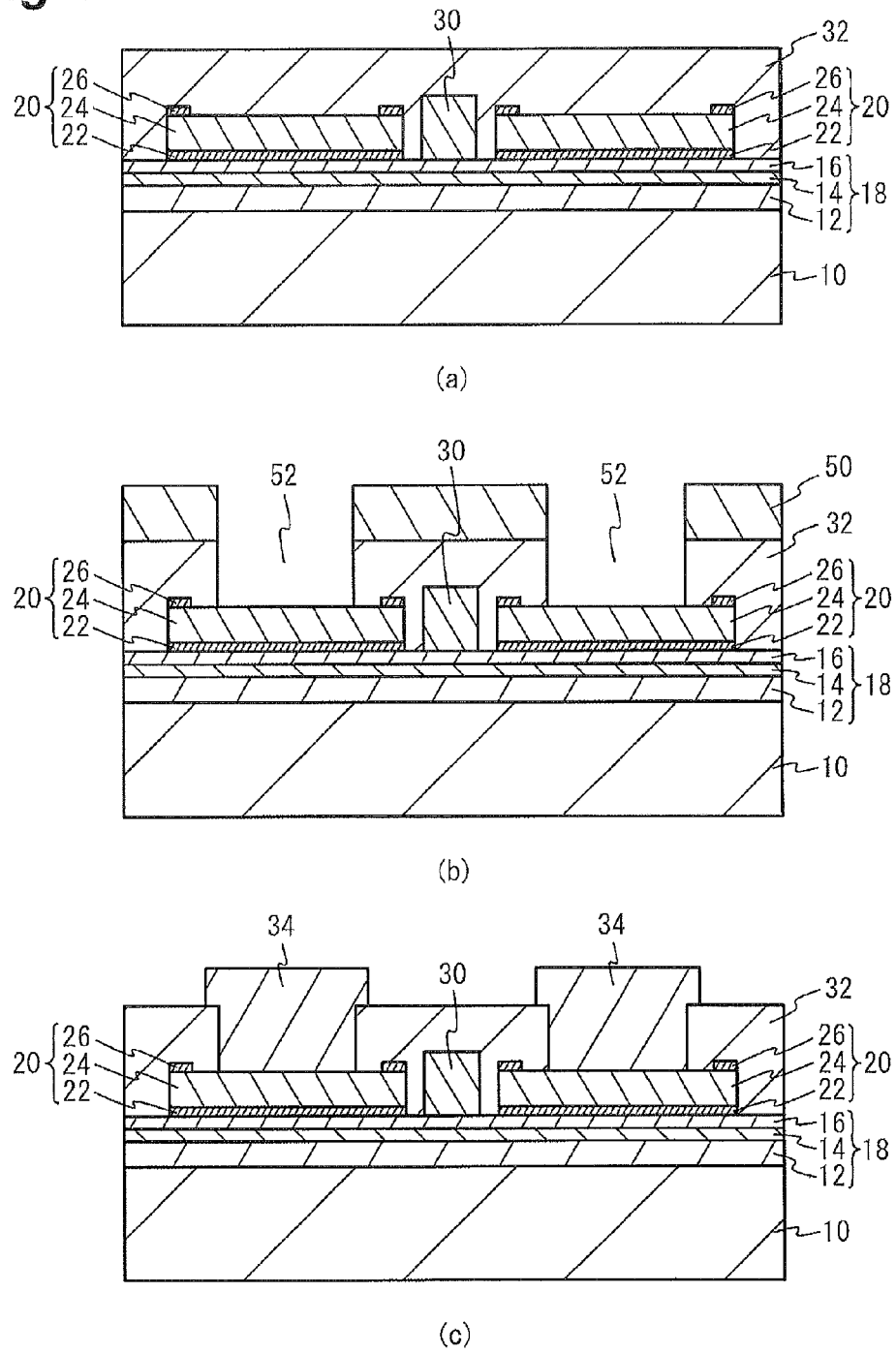
FIG. 4(a) to FIG. 4(c) are cross-sectional views (Part 3) showing the method of manufacturing the semiconductor device according to Embodiment 1.

Next, a method of manufacturing the semiconductor device according to Embodiment 1 will be described. FIGS. 2(a) to 4(c) are cross-sectional views showing the method of manufacturing the semiconductor device according to Embodiment 1. As shown in FIG. 2(a), the electron transit layer 12, electron supply layer 14, and cap layer 16 are formed as the nitride semiconductor layer 18 on the substrate 10. The nitride semiconductor layer 18 can be formed, for example, by use of the Metal Organic Chemical Vapor Deposition (MOCVD) process. A resist film 40 having apertures in the regions where the ohmic electrodes 20 are to be formed is formed on the nitride semiconductor layer 18. As shown in FIG. 2(b), using the resist film 40 as a mask, Ta layers 42, Al layers 44, and Ta layers 46 are formed in order, for example, by use of the evaporation process. As shown in FIG. 2(c), the resist film 40 is removed by lift-off and, thereafter, a resist film 48 is formed so as to cover the Ta layers 46 formed on peripheral areas of top faces of the Al layers 44 but expose the Ta layers 46 formed on the other regions.

As shown in FIG. 3(a), using the resist film 48 as a mask, the Ta layers 46 are removed by etching. The removal of the Ta layers 46 may be performed by use of dry etching or by use of wet etching. After this step, the Ta layers 46 remain only on the peripheral areas of the top faces of the Al layers 44. The Ta layers 46 are removed in part whereby windows 26a are formed in the respective coating metal layers 26. As shown in FIG. 3(b), after the resist film 48 is removed, an anneal treatment (thermal treatment) is carried out for the Ta layers 42, Al layers 44, and Ta layers 46. The anneal treatment can be performed, for example, at a temperature of not less than 500° C. and not more than 800° C. and is preferably performed at a temperature of not less than 500° C. and not more than 600° C. This treatment results in forming the ohmic electrodes 20 each having the first electrode 22 consisting of the Ta layer 42, the second electrode 24 consisting of the Al layer 44, and the coating metal layer 26 consisting of the Ta layer 46. Next, as shown in FIG. 3(c), the gate electrode 30 is formed on the nitride semiconductor layer 18 between the ohmic electrodes 20, for example, by use of the evaporation process and lift-off process.

As shown in FIG. 4(a), the interlayer dielectric film 32 is formed on the nitride semiconductor layer 18 so as to cover the ohmic electrodes 20 and the gate electrode 30. The interlayer dielectric film 32 can be formed, for example, by use of the Plasma-Enhanced Chemical Vapor Deposition (PCVD) process. The interlayer dielectric film 32 can be, for example, a silicon nitride (SiN) film. The silicon nitride (SiN) film has a film thickness of 4000 nm and a refractive index of 2.0 to 2.3. The film thickness of the interlayer dielectric film 32 should preferably be, for example, 50 nm to 800 nm. Additionally, the interlayer dielectric film 32 may also use a silicon oxide film or silicon oxynitride film, aside from a silicon nitride (SiN) film. As shown in FIG. 4(b), a resist film 50 having apertures over the ohmic electrodes 20 is formed on the interlayer dielectric film 32. Using the resist film 50 as a mask, the interlayer dielectric film 32 is removed by etching. This step results in forming apertures 52 in the interlayer dielectric film 32 on the ohmic electrodes 20. The removal of the interlayer dielectric film 32 may be performed by use of dry etching or by use of wet etching. As shown in FIG. 4(c), the wiring layers 34 are formed in the respective apertures 52, for example, by use of the evaporation process and lift-off process or by use of the plating process. The semiconductor device according to Embodiment 1 is formed by the method including the above-described steps.

Figure 5:
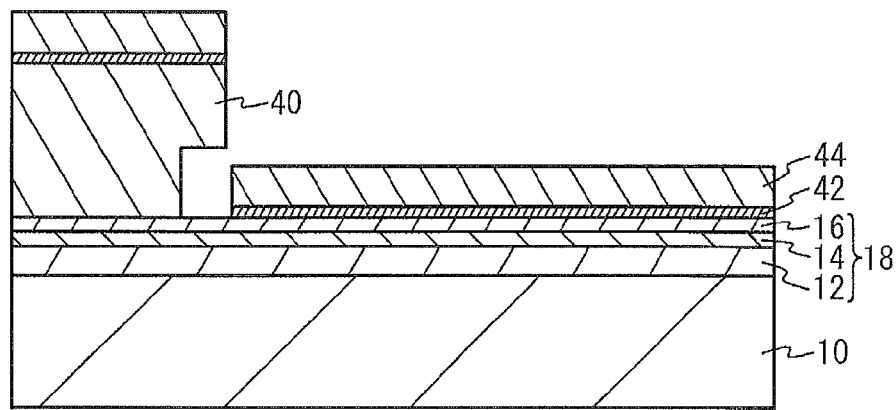
FIG. 5(a) to FIG. 5(c) are cross-sectional views showing a method of manufacturing a semiconductor device according to Comparative Embodiment 1.
Figure 5:
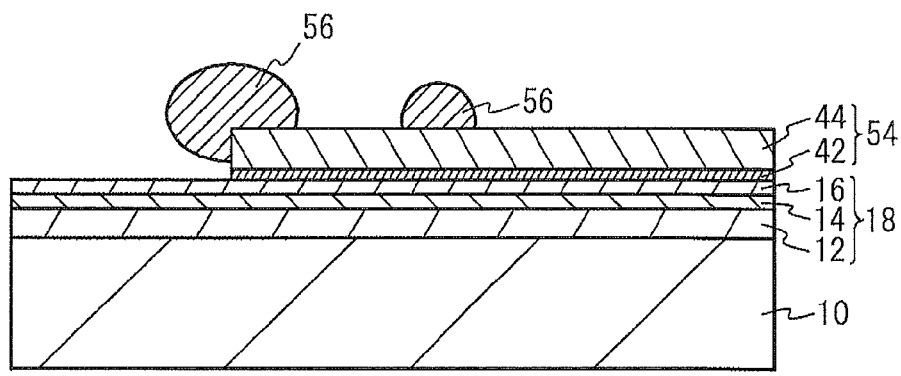
Figure 5:
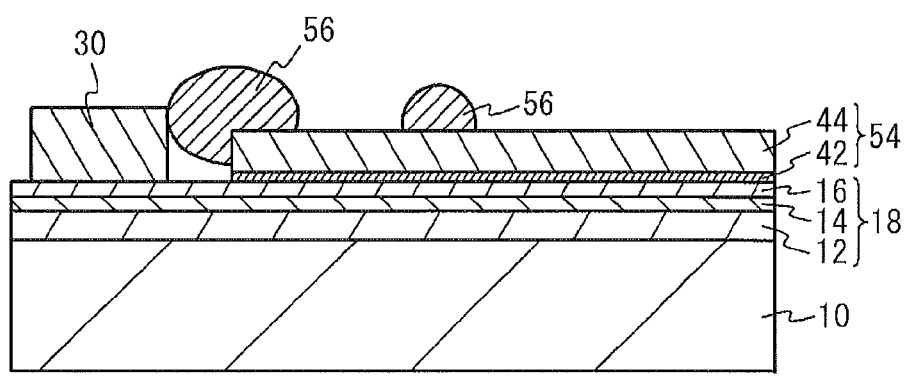

For explaining the effects of Embodiment 1, Comparative Embodiment 1 and Comparative Embodiment 2 will be described first. The semiconductor devices of Comparative Embodiment 1 and Comparative Embodiment 2 have the same configuration as the semiconductor device of Embodiment 1, except for the difference of the configuration of the ohmic electrodes. For this reason, Comparative Embodiment 1 and Comparative Embodiment 2 will be described mainly with focus on the ohmic electrodes. FIGS. 5(a) to 5(c) are cross-sectional views showing a method of manufacturing the semiconductor device according to Comparative Embodiment 1. As shown in FIG. 5(a), the resist film 40 is formed on the nitride semiconductor layer 18 as described with FIG. 2(a) in Embodiment 1 and, thereafter, using the resist film 40 as a mask, the Ta layers 42 and Al layers 44 are fainted in order, for example, by use of the evaporation process.

As shown in FIG. 5(b), after the resist film 40 is removed by lift-off, an anneal treatment is carried out for the Ta layers 42 and the Al layers 44 to form ohmic electrodes 54 each having the Ta layer 42 and Al layer 44. Through this anneal treatment hillocks 56 are generated due to the Al layers 44 of the ohmic electrodes 54. The hillocks 56 are generated at various locations, for example, on the top faces of the Al layers 44, on areas ranging from the top faces to the side faces, and so on. As shown in FIG. 5(c), the gate electrode 30 is formed on the nitride semiconductor layer 18 between the ohmic electrodes 54, for example, by use of the evaporation process and lift-off process. After that, the steps described with FIGS. 4(a) to 4(c) in Embodiment 1 are carried out.

In Comparative Embodiment 1, as shown in FIG. 5(c), the hillocks 56 generated due to the Al layers 44 of the ohmic electrodes 54 are located in proximity to or in contact with the gate electrode 30, so as to decrease the breakdown voltage between the gate electrode 30 and the ohmic electrodes 54. When a high voltage (e.g., 50 to 100 V) is applied to the ohmic electrodes 54 to implement high-voltage operation, an electric field is concentrated at the edges on the gate electrode 30 side of the ohmic electrodes 54, resulting in occurrence of dielectric breakdown.

Figure 6:
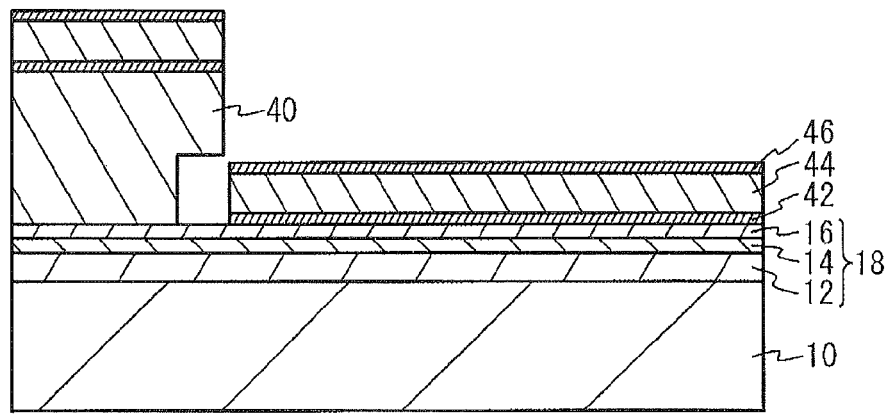
FIG. 6(a) to FIG. 6(c) are cross-sectional views showing a method of manufacturing a semiconductor device according to Comparative Embodiment 2.
Figure 6:
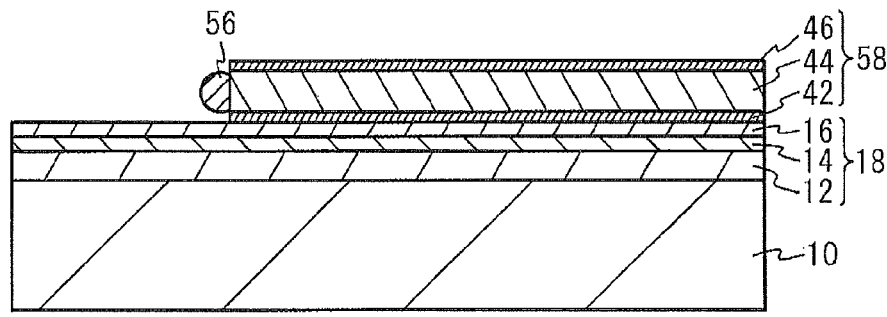
Figure 6:
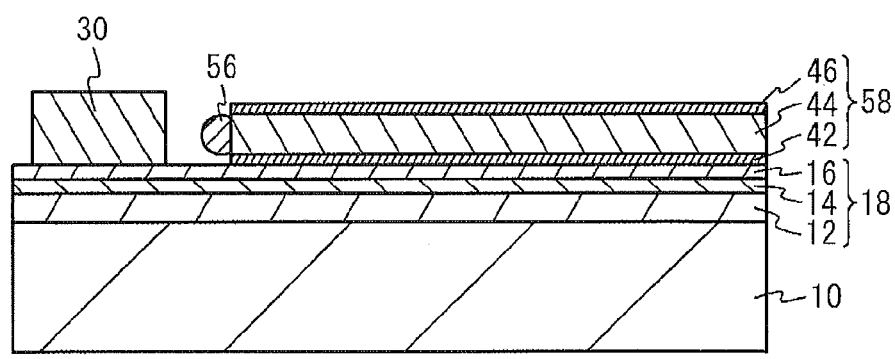

FIGS. 6(a) to 6(c) are cross-sectional views showing a method of manufacturing the semiconductor device according to Comparative Embodiment 2. As shown in FIG. 6(a), the resist film 40 is formed on the nitride semiconductor layer 18 as described with FIG. 2(a) in Embodiment 1 and, thereafter, using the resist film 40 as a mask, the Ta layers 42, Al layers 44, and Ta layers 46 are formed in order, for example, by use of the evaporation process. As shown in FIG. 6(b), after the resist film 40 is removed by lift-off, an anneal treatment is carried out for the Ta layers 42, Al layers 44, and Ta layers 46 to form ohmic electrodes 58 each having the Ta layer 42, Al layer 44, and Ta layer 46. Through this anneal treatment hillocks 56 are generated due to the Al layers 44 of the ohmic electrodes 58, but the hillocks 56 are generated only on the side faces of the Al layers 44 because the top faces of the Al layers 44 are covered by the respective Ta layers 46. As shown in FIG. 6(c), the gate electrode 30 is formed on the nitride semiconductor layer 18 between the ohmic electrodes 58, for example, by use of the evaporation process and lift-off process. After that, the steps described with FIGS. 4(a) to 4(c) in Embodiment 1 are carried out.

In Comparative Embodiment 2, since the Ta layer 46 is formed covering the top face of each Al layer 44, the hillocks 56 are generated only on the side face of the Al layer 44, as shown in FIG. 6(c), and thus the sizes of the hillocks can be made smaller. This can prevent the hillocks 56 from being located in proximity to or in contact with the gate electrode 30. However, when the Ta layer 46 is formed on the top face of the Al layer 44, eutectic reaction is inhibited between the Ta layer 42 and the Al layer 44 in the anneal treatment. Since the Ta layer 46 is provided so as to cover the top face of the Al layer 44, the eutectic reaction between the Ta layer 42 and the Al layer 44 is inhibited throughout the entire ohmic electrode 58 and, as a result, the ohmic electrode 58 comes to uniformly have a high contact resistance. Therefore, the concentration of the electric field occurs at the edge on the gate electrode 30 side of each ohmic electrode 58 in the high-voltage operation to cause dielectric breakdown.

Figure 7:
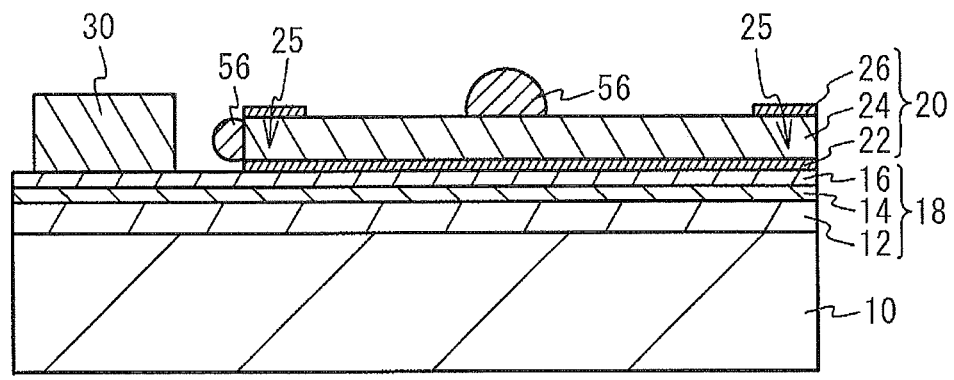
FIG. 7 is a cross-sectional view for explaining the effects by the ohmic electrodes in Embodiment 1.

FIG. 7 is a cross-sectional view for explaining the effects by the ohmic electrodes 20 in Embodiment 1. As shown in FIG. 7, each ohmic electrode 20 is configured so that the coating metal layer 26 consisting of the Ta layer is provided on the peripheral area of the top face of the second electrode 24 consisting of the Al layer, without the coating metal layer 26 in the central area of the top face of the second electrode 24. In this configuration, the hillocks 56 are generated on the top face and the side face of the second electrode 24 but the hillocks 56 are prevented from being generated in large size spreading from the top face to the side face. Therefore, the hillocks 56 are prevented from being located in proximity to or in contact with the gate electrode 30. Since the coating metal layer 26 is provided only on the peripheral area of the top face of the second electrode 24, there exists a high-resistance region 25 where the contact resistance is higher in the peripheral area of the ohmic electrode 20 than in the central area. This configuration disperses the electric field on each ohmic electrode 20 in the high-voltage operation, so as to prevent the electric field from being concentrated at the edge on the gate electrode 30 side of each ohmic electrode 20, which can suppress the dielectric breakdown.

The coating metal layer 26 also has an effect of preventing growth of hillocks 56 after the anneal treatment of the ohmic electrodes 20. Namely, an insulating film is provided on the ohmic electrodes 20. This insulating film has a function of a protecting film for the semiconductor device or a function to electrically isolate the electrodes from each other. A typical insulating film is the interlayer dielectric film 32 in FIG. 4. Incidentally, such insulating film applies stress to the ohmic electrodes 20 and, as a result, the hillocks 56 can grow after the anneal treatment. In some other cases, the hillocks can grow from the ohmic electrodes 20 if the thermal treatment is executed after formation of the insulating film. On the other hand, the coating metal layer 26 is provided in Embodiment 1, which can inhibit the growth of hillocks 56. Namely, the structure of Embodiment 1 also has the effect of preventing the hillocks from growing after formation of the insulating film on the ohmic electrodes 20 (i.e., on the coating metal layers 26).

According to Embodiment 1, as described above with FIGS. 2(a) to 4(c), the method has the step of forming the first electrode 22 on the top face of the nitride semiconductor layer 18, the step of forming the second electrode 24 on the top face of the first electrode 22, and the step of forming the coating metal layer 26 which covers the edge of the top face of the second electrode 24 and which has the window 26a exposing the top face of the second electrode 24 in the region separated from the foregoing edge. By this method, as shown in FIG. 1, each ohmic electrode 20 comes to have the first electrode 22 provided on the top face of the nitride semiconductor layer 18, the second electrode 24 provided on the top face of the first electrode 22, and the coating metal layer 26 covering the entire edge of the top face of the second electrode 24. This configuration prevents the hillocks 56 from being located in proximity to or in contact with the gate electrode 30, as described with FIG. 7. Since the high-resistance region 25 where the contact resistance between the nitride semiconductor layer 18 and the first electrode 22 is higher than in the region where the window 26a is provided, exists corresponding to the region where the coating metal layer 26 is provided, it can inhibit the dielectric breakdown due to the concentration of the electric field at the edge on the gate electrode 30 side of each ohmic electrode 20. Therefore, Embodiment 1 achieves improvement in reliability.

Since the coating metal layer 26 is provided only on the edge of the top face of the second electrode 24 but not provided on the central area, it can suppress increase in contact resistance of the ohmic electrode 20 and thus suppress degradation of characteristics.

Embodiment 1 shows the example where the structure having the first electrode 22, the second electrode 24, and the coating metal layer 26 constitutes both of the source electrode and the drain electrode arranged next to the gate electrode 30, but the present invention is also applicable to cases where the structure constitutes at least one of them. Furthermore, Embodiment 1 shows the example where the coating metal layer 26 covers the entire edge of the top face of the second electrode 24, but it is sufficient that the coating metal layer 26 be arranged so as to cover at least the edge on the side closer to the gate electrode 30 in the top face of the second electrode 24. This configuration can prevent the hillocks 56 from being located in proximity to or in contact with the gate electrode 30 and prevent the dielectric breakdown due to the concentration of the electric field at the edge on the gate electrode 30 side of each ohmic electrode 20. For further decreasing the contact resistance of the ohmic electrode 20, the coating metal layer 26 may be provided so as to cover only the edge on the gate electrode 30 side of the top face of the second electrode 24. Since the reliability degrades even with the hillocks 56 being located in proximity to or in contact with any metal layer other than the gate electrode 30, the coating metal layer 26 may be provided so as to cover a portion where the generation of hillocks 56 is desired to be suppressed, in the peripheral area except for the peripheral area on the gate electrode 30 side of the top face of the second electrode 24. As in Embodiment 1, the coating metal layer 26 may be provided so as to cover the entire edge of the top face of the second electrode 24.

Through the anneal treatment described with FIG. 3(b), grains are created in the second electrode 24 of the Al layer and the hillocks 56 are generated from the grains. The sizes of the grains are dependent on the temperature of the anneal treatment; the grains grow larger at higher temperatures and smaller at lower temperatures. By the 500° C. or higher anneal treatment, the grains grow 1 μm or more. Therefore, the width X2 of the coating metal layer 26 (cf. FIG. 1) is preferably the size enough to suppress the generation of hillocks 56 from the grains created in the second electrode 24; for example, the width X2 is preferably not less than 0.5 μm and more preferably not less than 1.0 μm. If the width X2 of the coating metal layer 26 is too large, the contact resistance of the ohmic electrode 20 will become larger and it will become difficult to suppress the dielectric breakdown at the edge. Accordingly, the width X2 of the coating metal layer 26 is preferably not more than 4.0 μm and more preferably not more than 2.0 μm.

From the viewpoint of suppressing the generation of hillocks 56 spreading from the top face to the side face of the second electrode 24, the coating metal layer 26 is preferably provided so as to cover the edge of the top face of the second electrode 24 and extend from the edge toward the central area. For example, the side face of the coating metal layer 26 is preferably flush with the side face of the second electrode 24.

Besides Ta, the first electrode 22 may be an electrode containing titanium (Ti). The second electrode 24 is preferably an Al-containing layer which is the thickest layer in the ohmic electrode 20. The coating metal layer 26 may be a layer other than the Ta layer as long as it is a metal layer that can suppress the generation of hillocks 56. For example, the coating metal layer 26 may be a metal layer containing at least one of Ta, molybdenum (Mo), palladium (Pd), nickel (Ni), and Ti. The film thickness of the coating metal layer 26 is preferably not less than 1 nm and not more than 50 nm and more preferably not less than 10 nm and not more than 30 nm, for suppressing the generation of hillocks 56.

Figure 8:
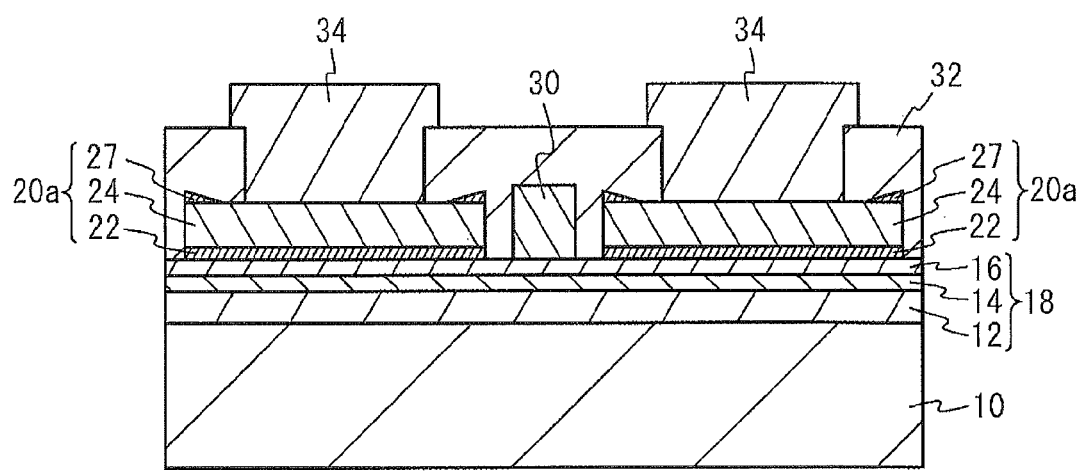
FIG. 8 is a cross-sectional view showing a semiconductor device according to Modification 1 of Embodiment 1.

FIG. 8 is a cross-sectional view showing a semiconductor device according to Modification 1 of Embodiment 1. In Modification 1 of Embodiment 1, as shown in FIG. 8, the thickness of a coating metal layer 27 of each ohmic electrode 20a is not constant but gradually decreases from the edge toward the central area of the second electrode 24. The other configuration is the same as in Embodiment 1 and therefore the description thereof is omitted herein. In this manner, the thickness of the coating metal layer 27 may be set so as to gradually decrease from the edge toward the central area of the second electrode 24. This setting allows the contact resistance of the ohmic electrode 20a to gradually decrease from the edge toward the central area, which can further relieve the electric field at the edge of the ohmic electrode 20a.

Embodiment 2

Figure 9:
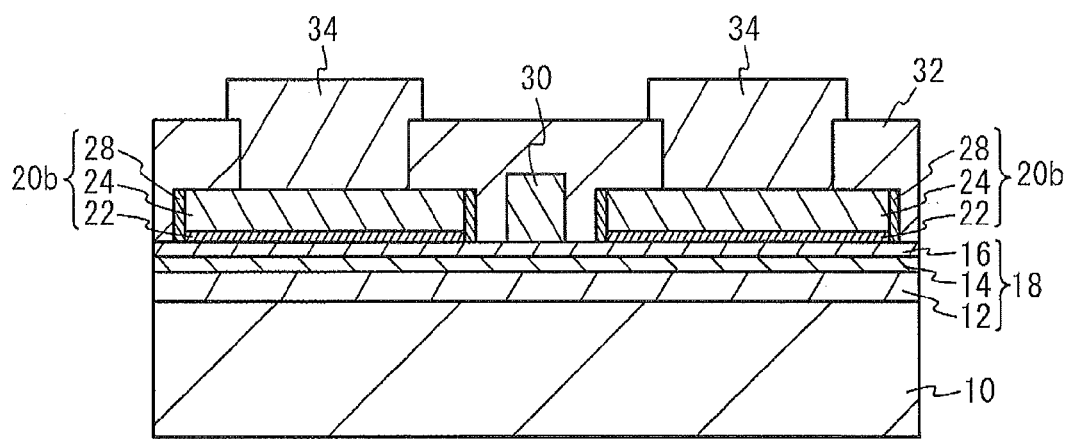
FIG. 9 is a cross-sectional view showing a semiconductor device according to Embodiment 2.

FIG. 9 is a cross-sectional view showing a semiconductor device according to Embodiment 2. In Embodiment 2, as shown in FIG. 9, each of ohmic electrodes 20b is configured so that a coating metal layer 28 is provided on the side face of the second electrode 24, without the coating metal layer 26 on the edge of the top face of the second electrode 24. The coating metal layer 28 is, for example, a Ta layer in the film thickness of 20 nm. Embodiment 2 will describe an example where the coating metal layer 28 is provided so as to cover the entire side face of the second electrode 24. Since the other configuration is the same as in Embodiment 1, the description thereof is omitted herein.

Figure 10:
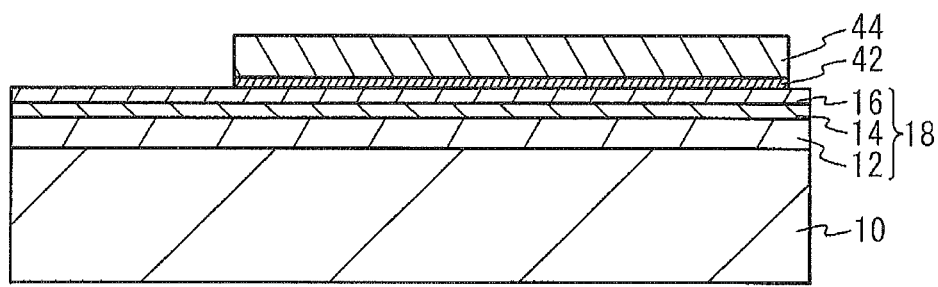
FIG. 10(a) to FIG. 10(c) are cross-sectional views (Part 1) showing a method of manufacturing the semiconductor device according to Embodiment 2.
Figure 10:
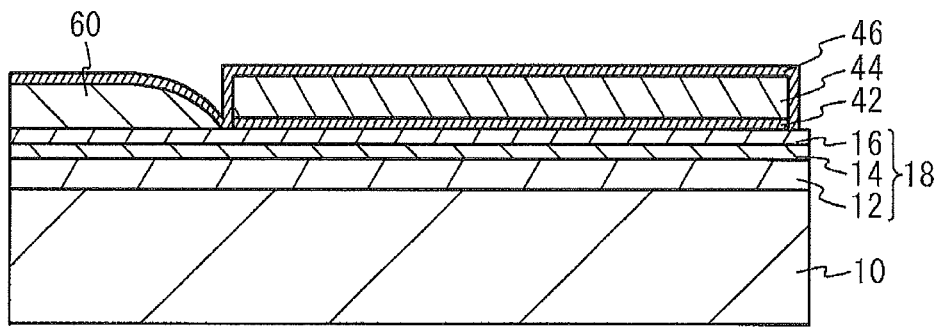
Figure 10:
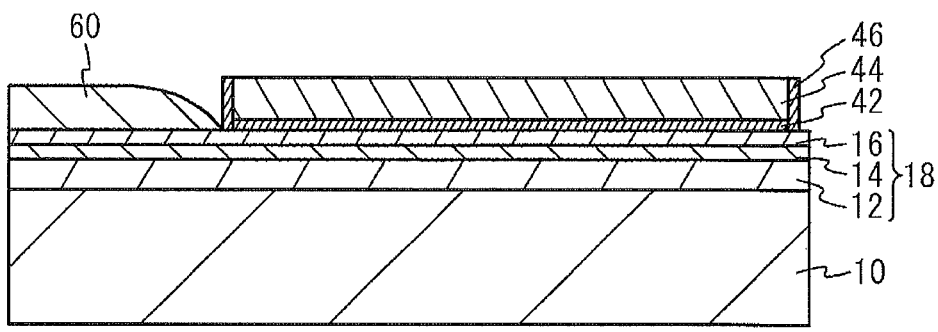
Figure 11:
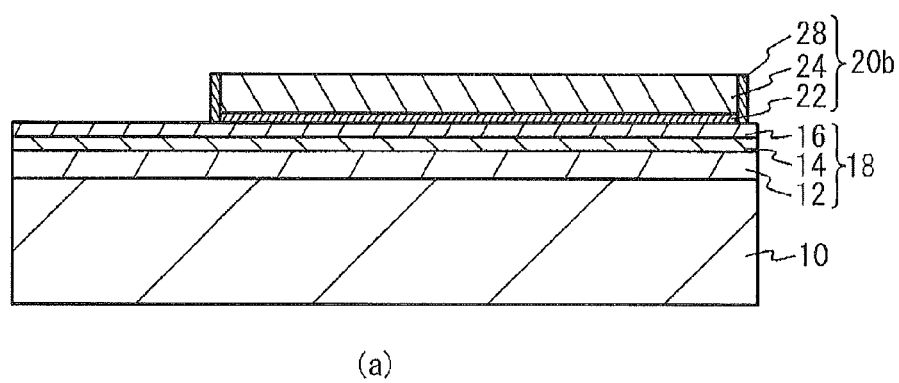
FIG. 11(a) and FIG. 11(b) are cross-sectional views (Part 2) showing the method of manufacturing the semiconductor device according to Embodiment 2.
Figure 11:
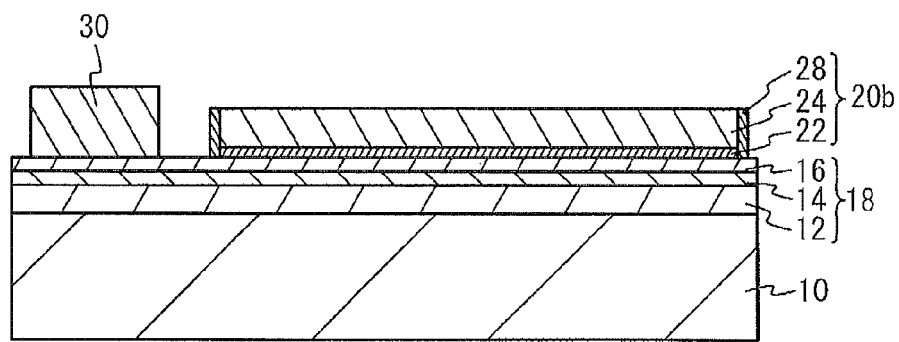

Next, a method of manufacturing the semiconductor device according to Embodiment 2 will be described. Since the semiconductor device of Embodiment 2 is, as shown in FIG. 9, the same as that of Embodiment 1 except for the difference of the configuration of the ohmic electrodes, the method of manufacturing the semiconductor device of Embodiment 2 will be described mainly with focus on the ohmic electrodes. FIGS. 10(a) to 11(b) are cross-sectional views showing the method of manufacturing the semiconductor device according to Embodiment 2. As shown in FIG. 10(a), the electron transit layer 12, electron supply layer 14, and cap layer 16 are formed as the nitride semiconductor layer 18 on the substrate 10. On the nitride semiconductor layer 18, the Ta layers 42 and Al layers 44 are formed on the regions where the ohmic electrodes 20b are to be formed, for example, by use of the evaporation process and the lift-off process.

As shown in FIG. 10(b), a resist film 60 is formed so as to expose the top face and side face of each Al layer 44, in the regions other than the regions where the Ta layers 42 and Al layers 44 are formed. Such resist film 60 with the edge in a curved shape can be formed by carrying out a thermal treatment for the resist film 60. Thereafter, the Ta layers 46 are formed, for example, by use of the sputtering process. By use of the sputtering process, the Ta layer 46 is formed so as to cover the top face and side face of each Al layer 44. As shown in FIG. 10(c), the Ta layers 46 are etched back. The etch-back process can be performed, for example, by use of anisotropic etching such as dry etching. This process results in removing the Ta layers 46 formed on the top faces of the Al layers 44 and thus the Ta layers 46 remain only on the side faces of the Al layers 44.

As shown in FIG. 11(a), after the resist film 60 is removed, an anneal treatment is carried out for the Ta layers 42, Al layers 44, and Ta layers 46. This treatment results in forming the ohmic electrodes 20b each having the first electrode 22 consisting of the Ta layer 42, the second electrode 24 consisting of the Al layer 44, and the coating metal layer 28 consisting of the Ta layer 46. As shown in FIG. 11(b), the gate electrode 30 is formed on the nitride semiconductor layer 18 between the ohmic electrodes 20b, for example, by use of the evaporation process and lift-off process. After that, the steps described with FIGS. 4(a) to 4(c) in Embodiment 1 are carried out. The semiconductor device according to Embodiment 2 is formed by the method including the above steps.

Figure 12:
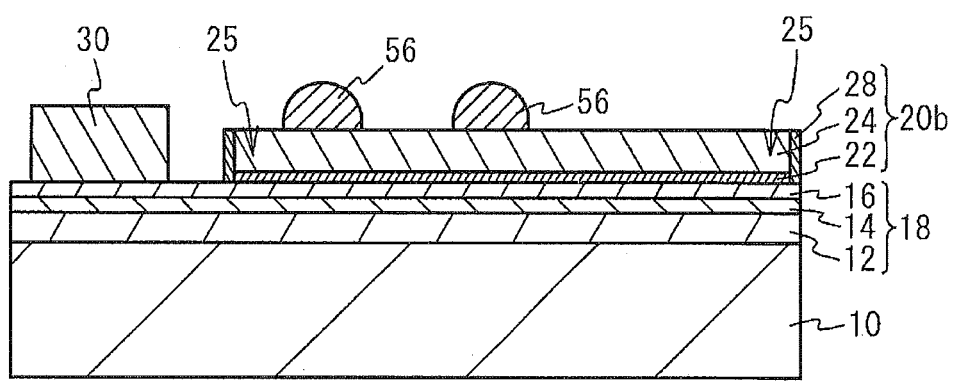
FIG. 12 is a cross-sectional view for explaining the effects by the ohmic electrodes in Embodiment 2.

FIG. 12 is a cross-sectional view for explaining the effects by the ohmic electrodes 20b in Embodiment 2. As shown in FIG. 12, each ohmic electrode 20b is configured so that the coating metal layer 28 of the Ta layer is provided on the side face of the second electrode 24 of the Al layer. In this configuration the hillocks 56 can be generated from the top face of the second electrode 24 but this configuration can prevent the hillocks 56 from being generated spreading from the top face to the side face and the hillocks 56 from being generated on the side face. This can prevent the hillocks 56 from being located in proximity to or in contact with the gate electrode 30. When the coating metal layer 28 is formed on the side face of the second electrode 24, the coating metal layer 28 prevents the eutectic reaction between the second electrode 24 and the first electrode 22 in the anneal treatment from occurring in the peripheral area where the coating metal layer 28 is formed. For this reason, there exists the high-resistance region 25 where the contact resistance is higher at the edge of the ohmic electrode 20b than in the central area. Therefore, the electric field on each ohmic electrode 20b is dispersed in the high-voltage operation to prevent the electric field from being concentrated at the edge on the gate electrode 30 side of each ohmic electrode 20b, whereby the dielectric breakdown can be suppressed.

According to Embodiment 2, as described above with FIGS. 10(a) to 11(b), the method has the step of forming the first electrode 22 on the top face of the nitride semiconductor layer 18, the step of forming the second electrode 24 on the top face of the first electrode 22, and the step of forming the coating metal layer 28 covering the entire side face of the second electrode 24. By this method, as shown in FIG. 9, each ohmic electrode 20b has the first electrode 22 provided on the top face of the nitride semiconductor layer 18, the second electrode 24 provided on the top face of the first electrode 22, and the coating metal layer 28 covering the entire side face of the second electrode 24. This configuration can prevent the hillocks 56 from being located in proximity to or in contact with the gate electrode 30, as described above with FIG. 12. It can also prevent the dielectric breakdown due to the concentration of the electric field at the edge on the gate electrode 30 side of each ohmic electrode 20b. Therefore, Embodiment 2 achieves improvement in reliability.

The coating metal layer 28 also has the effect of preventing the growth of hillocks 56 after the anneal treatment of the ohmic electrodes 20b. Namely, an insulating film is provided on the ohmic electrodes 20b. This insulating film has, for example, a function of a protecting film for the semiconductor device or a function to electrically isolate the electrodes from each other. A typical insulating film is the interlayer dielectric film 32 in FIG. 9. Incidentally, such insulating film applies stress to the ohmic electrodes 20b and, as a result, the hillocks 56 can grow after the anneal treatment. In some other cases, the hillocks can grow from the ohmic electrodes 20b if the thermal treatment is executed after formation of the insulating film. On the other hand, the coating metal layer 28 is provided in Embodiment 2, which can prevent the growth of hillocks 56. Namely, the structure of Embodiment 2 also has the effect of preventing the hillocks from growing after formation of the insulating film on the ohmic electrodes 20b.

Furthermore, since the coating metal layer 28 is provided only on the side face of the second electrode 24, this configuration can suppress increase in contact resistance of each ohmic electrode 20b and thus prevent degradation of characteristics.

Embodiment 2 shows the example where the structure having the first electrode 22, the second electrode 24, and the coating metal layer 28 constitutes both of the source electrode and the drain electrode arranged next to the gate electrode 30, but the present invention is also applicable to cases where the structure constitutes at least one of them. Furthermore, Embodiment 2 shows the example where the coating metal layer 28 is provided so as to cover the entire side face of the second electrode 24, but it is sufficient that the coating metal layer 28 be provided so as to cover at least the side face on the side closer to the gate electrode 30 in the second electrode 24. This configuration can prevent the hillocks 56 from being located in proximity to or in contact with the gate electrode 30 and prevent the dielectric breakdown due to the concentration of the electric field at the edge on the gate electrode 30 side of each ohmic electrode 20b. For further decreasing the contact resistance of the ohmic electrode 20b, the coating metal layer 28 may be provided so as to cover only the side face on the gate electrode 30 side in the second electrode 24. Since the reliability degrades even with the hillocks 56 being located in proximity to or in contact with any metal layer other than the gate electrode 30, the coating metal layer 28 may be provided so as to cover a portion where the generation of hillocks 56 is desired to be suppressed, in the side face except for the side face on the gate electrode 30 side of the second electrode 24. As in Embodiment 2, the coating metal layer 28 may be provided so as to cover the entire side face of the second electrode 24.

The coating metal layer 28 may be provided in part between the upper edge and the lower edge of the side face of the second electrode 24, but it is preferably provided so as to extend at least from the upper edge toward the lower side and more preferably provided so as to extend from the upper edge to the lower edge, as shown in FIG. 9. It is because such configuration can further suppress the generation of hillocks 56 on the side face of the second electrode 24.

The coating metal layer 28 may be a layer other than the Ta layer as long as it is a metal layer capable of suppressing the generation of hillocks 56. For example, the coating metal layer 28 may be a metal layer containing at least one of Ta, Mo, Pd, Ni, and Ti.

Embodiment 3

Figure 13:
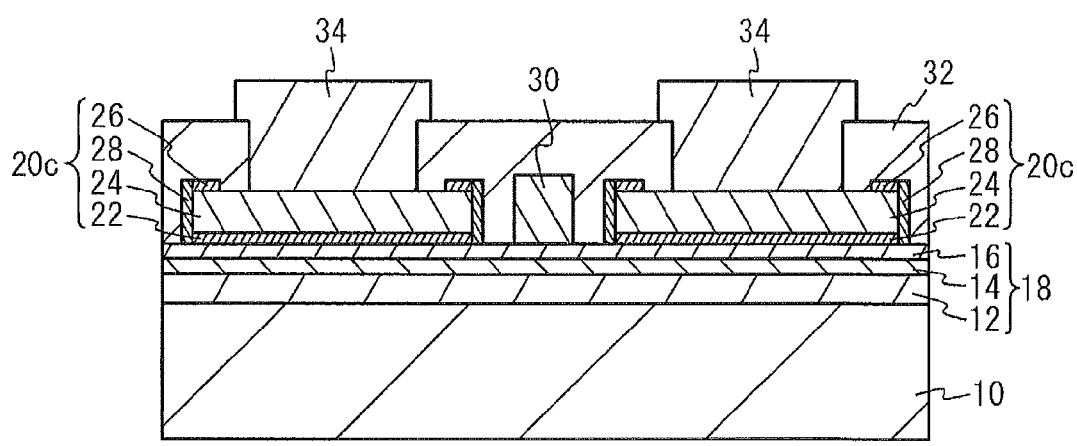
FIG. 13 is a cross-sectional view showing a semiconductor device according to Embodiment 3.

FIG. 13 is a cross-sectional view showing a semiconductor device according to Embodiment 3. In Embodiment 3, as shown in FIG. 13, each ohmic electrode 20c has both of the coating metal layer 26 and the coating metal layer 28. The coating metal layer 26 and the coating metal layer 28 are preferably connected so as to be integrated, as shown in FIG. 13, but they may be isolated from each other. The other configuration is the same as in Embodiment 1 and Embodiment 2 and thus the description thereof is omitted herein.

Figure 14:
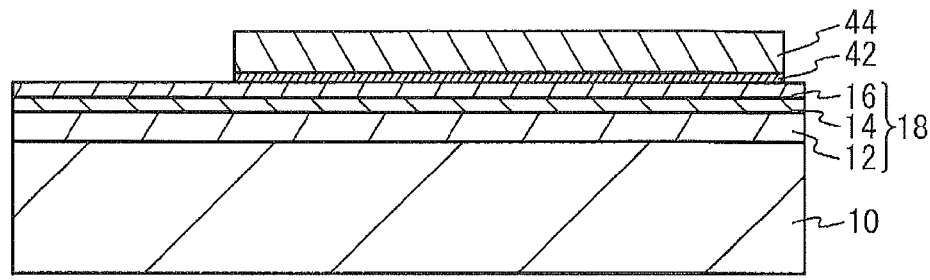
FIG. 14(a) to FIG. 14(c) are cross-sectional views (Part 1) showing a method of manufacturing the semiconductor device according to Embodiment 3.
Figure 14:
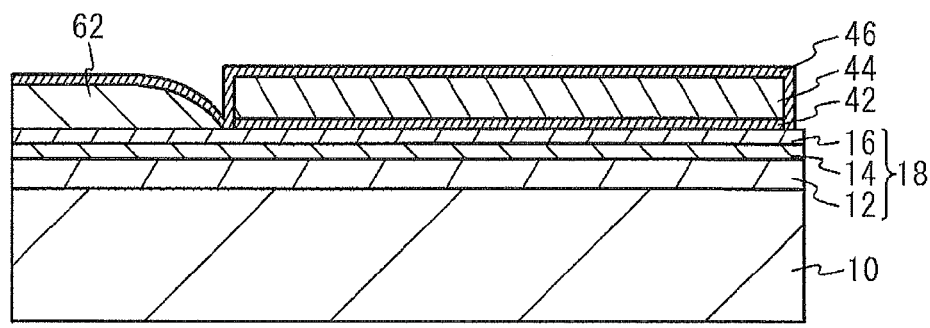
Figure 14:
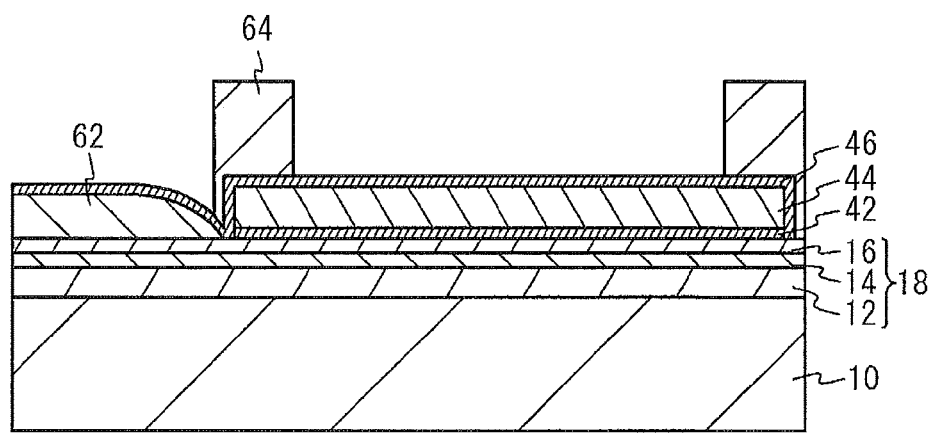
Figure 15:
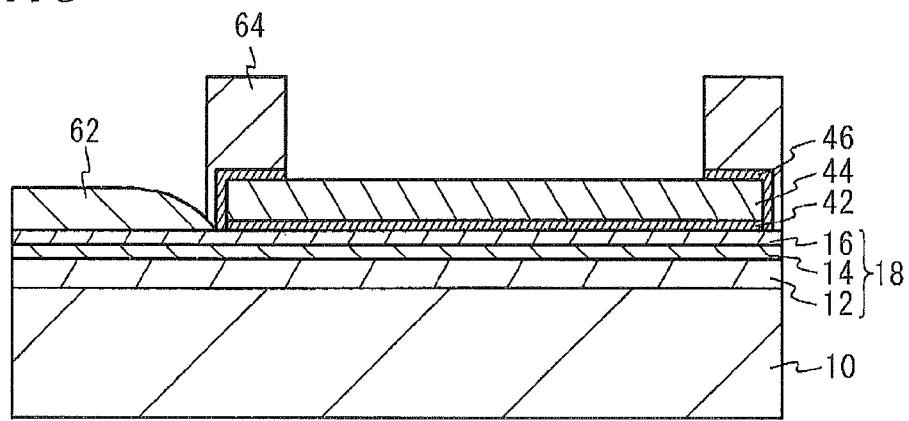
FIG. 15(a) to FIG. 15(c) are cross-sectional views (Part 2) showing the method of manufacturing the semiconductor device according to Embodiment 3.
Figure 15:
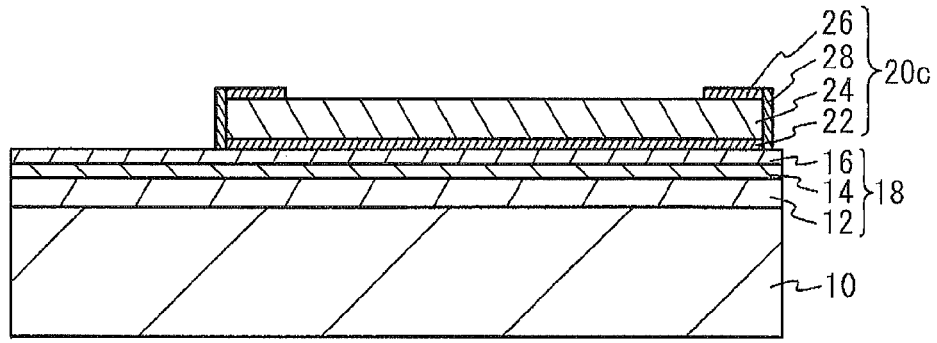
Figure 15:
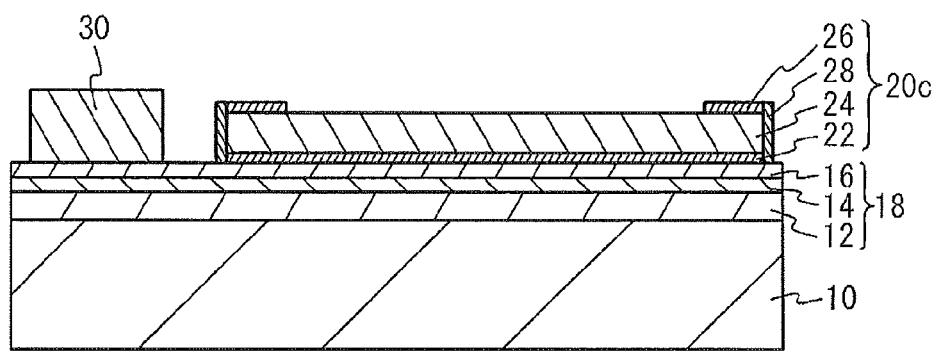

Next, a method of manufacturing the semiconductor device according to Embodiment 3 will be described. In Embodiment 3 as well as in Embodiment 2, the method of manufacturing the semiconductor device of Embodiment 3 will be described mainly with focus on the ohmic electrodes. FIGS. 14(a) to 15(c) are cross-sectional views showing the method of manufacturing the semiconductor device according to Embodiment 3. As shown in FIG. 14(a), the electron transit layer 12, electron supply layer 14, and cap layer 16 are formed as the nitride semiconductor layer 18 on the substrate 10. The Ta layers 42 and Al layers 44 are formed in the regions where the ohmic electrodes 20c are to be formed, on the nitride semiconductor layer 18, for example, by use of the evaporation process and lift-off process.

As shown in FIG. 14(b), a resist film 62 is formed so as to expose the top face and side face of each Al layer 44, in the regions other than the regions where the Ta layers 42 and the Al layers 44 are formed. The resist film 62 with the edge in a curved shape can be formed by carrying out a thermal treatment for the resist film 62, as described above. Thereafter, the Ta layers 46 are formed, for example, by the sputtering process. By use of the sputtering process, the Ta layer 46 is formed so as to cover the top face and the side face of each Al layer 44. As shown in FIG. 14(c), a resist film 64 is formed so as to cover the Ta layer 46 formed on the side face and the edge of the top face of each Al layer 44 and expose the Ta layer 46 in the other regions.

As shown in FIG. 15(a), using the resist film 64 as a mask, the Ta layers 46 are removed by etching. The removal of the Ta layers 46 can be implemented, for example, by use of anisotropic etching such as dry etching. After this step, the Ta layer 46 remains only on the side face and on the peripheral area of the top face of each Al layer 44. As shown in FIG. 15(b), after the resist films 62, 64 are removed, the anneal treatment is carried out for the Ta layers 42, Al layers 44, and Ta layers 46. This treatment results in forming the ohmic electrodes 20c each having the first electrode 22 consisting of the Ta layer 42, the second electrode 24 consisting of the Al layer 44, and the coating metal layer 26 and the coating metal layer 28 consisting of the Ta layer 46. As shown in FIG. 15(c), the gate electrode 30 is formed on the nitride semiconductor layer 18 between the ohmic electrodes 20c, for example, by use of the evaporation process and lift-off process. After that, the steps described with FIGS. 4(a) to 4(c) in Embodiment 1 are carried out. The semiconductor device according to Embodiment 3 is formed by the method including the above steps.

According to Embodiment 3, the coating metal layers 26, 28 are provided on both of the edge of the top face and the side face of the second electrode 24. This enhances the effect of suppressing the generation of the hillocks 56 spreading from the top face to the side face of the second electrode 24 and the hillocks 56 on the side face, and can further prevent the hillocks 56 from being located in proximity to or in contact with the gate electrode 30. It can also certainly suppress the dielectric breakdown due to the concentration of the electric field at the edge on the gate electrode 30 side of each ohmic electrode 20c. Therefore, Embodiment 3 achieves improvement in reliability.

As shown in FIG. 13, the coating metal layer 26 covering the edge of the top face of the second electrode 24 and the coating metal layer 28 covering the side face of the second electrode 24 are preferably electrically connected. It is because the foregoing configuration can effectively suppress the generation of hillocks 56 spreading from the top face to the side face of the second electrode 24. The coating metal layer 26 and the coating metal layer 28 are preferably composed of an identical material. It is because the foregoing configuration allows the coating metal layer 26 and the coating metal layer 28 to be formed at the same time. Therefore, it is feasible, for example, to readily obtain the configuration wherein the coating metal layer 26 and the coating metal layer 28 are connected so as to be integrated.

Embodiments 1 to 3 show the examples of HEMTs having the nitride semiconductor layer 18 including the electron transit layer 12 and the electron supply layer 14 with the bandgap larger than that of the electron transit layer 12, but the present invention may also be applied to other semiconductor devices using nitride semiconductor layers. The nitride semiconductors refer to III-V nitride semiconductors and examples thereof include InN, InAlN, InGaN, InAlGaN, and so on, in addition to GaN and AlGaN.

The above details the examples of the present invention but it should be noted that the present invention is not limited to such specific examples and can be modified or changed in many ways without departing from the scope of the present invention described in the scope of claims.

What is claimed is:

1. A method of manufacturing a semiconductor device, comprising:
   a first step of forming a first electrode containing Ti or Ta on a top face of a nitride semiconductor layer;
   a second step of forming a second electrode containing Al on a top face of the first electrode;
   a third step of forming a coating metal layer covering at least one of an edge of a top face of the second electrode and a side face of the second electrode, having a window exposing the top face of the second electrode in a region separated from the edge, and containing at least one of Ta, Mo, Pd, Ni, and Ti; and
   a step of performing a thermal treatment, after the third step.

2. The method according to claim 1, wherein a structure having the first electrode, the second electrode, and the coating metal layer constitutes at least one of a source electrode and a drain electrode arranged next to a gate electrode and wherein the coating metal layer is arranged on at least one of the edge of the top face of the second electrode and the side face of the second electrode on the side near to the gate electrode.

3. The method according to claim 1, wherein the coating metal layer is provided on both of the edge of the top face of the second electrode and the side face of the second electrode.

4. The method according to claim 3, wherein the coating metal layer covering the edge of the top face of the second electrode and the coating metal layer covering the side face of the second electrode are electrically connected.

5. The method according to claim 3, wherein the coating metal layer covering the edge of the top face of the second electrode and the coating metal layer covering the side face of the second electrode are composed of an identical material.

6. The method according to claim 1, wherein the nitride semiconductor layer is gallium nitride or aluminum gallium nitride and wherein the thermal treatment is carried out between 500° C. to 800° C.

7. The method according to claim 1, wherein the coating metal layer provided on the side face of the second electrode is formed by carrying out anisotropic etching of the coating metal layer which formed on the second electrode.

* * * * *